(12) United States Patent
Yosui et al.

(10) Patent No.: US 10,123,414 B2
(45) Date of Patent: Nov. 6, 2018

(54) MULTILAYER CIRCUIT BOARD USING LASER DIRECT STRUCTURING ADDITIVE

(71) Applicant: Murata Manufacturing Co., Ltd., Nagaokakyo-shi, Kyoto-fu (JP)

(72) Inventors: Kuniaki Yosui, Nagaokakyo (JP); Bunta Okamoto, Nagaokakyo (JP); Isamu Morita, Nagaokakyo (JP); Jun Sasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/442,769

(22) Filed: Feb. 27, 2017

(65) Prior Publication Data

US 2017/0188459 A1    Jun. 29, 2017

Related U.S. Application Data

(63) Continuation of application No. PCT/JP2015/073470, filed on Aug. 21, 2015.

(30) Foreign Application Priority Data

Aug. 29, 2014  (JP) ................... 2014-175600
Dec. 3, 2014   (JP) ................... 2014-245316
Mar. 4, 2015   (JP) ................... 2015-042598

(51) Int. Cl.
*H05K 1/11*   (2006.01)
*H05K 3/18*   (2006.01)
(Continued)

(52) U.S. Cl.
CPC .......... *H05K 1/115* (2013.01); *H05K 1/0237* (2013.01); *H05K 3/105* (2013.01); *H05K 3/18* (2013.01);
(Continued)

(58) Field of Classification Search
CPC ........ H05K 1/0237; H05K 3/105; H05K 3/18; H05K 3/182; H05K 3/403; H05K 1/115
(Continued)

(56) References Cited

U.S. PATENT DOCUMENTS 9,745,465 B2 * 8/2017 Motegi ................... C08K 7/14
2006/0286365 A1 12/2006 Lee et al.
(Continued)

FOREIGN PATENT DOCUMENTS

JP    56-10791 A    2/1981
JP    10-270819 A   10/1998
(Continued)

OTHER PUBLICATIONS

Machine Translation of Japanese Patent Publication No. 2003-069239, Ikeda (Mar. 7, 2003).*
(Continued)

*Primary Examiner* — Tremesha S Willis
(74) *Attorney, Agent, or Firm* — Keating & Bennett, LLP

(57) ABSTRACT

A process of manufacturing a multilayer circuit board includes patterning insulating substrates on which conductors are formed to provide a signal conductor, a first ground conductor, and a second ground conductor. The insulating substrates including the signal conductor, the first ground conductor, and the second ground conductor are stacked and thermally crimped to form a laminate. An interlayer connection conductor is formed on a surface of the laminate by a Laser Direct Structuring process.

8 Claims, 23 Drawing Sheets

(51) Int. Cl.
*H05K 3/46* (2006.01)
*H05K 1/02* (2006.01)
*H05K 3/10* (2006.01)
*H05K 3/40* (2006.01)
*H05K 1/16* (2006.01)

(52) U.S. Cl.
CPC ............. *H05K 3/182* (2013.01); *H05K 3/403* (2013.01); *H05K 3/46* (2013.01); *H05K 3/4632* (2013.01); *H05K 1/025* (2013.01); *H05K 1/117* (2013.01); *H05K 1/165* (2013.01); *H05K 3/4617* (2013.01); *H05K 2201/041* (2013.01); *H05K 2201/09354* (2013.01); *H05K 2203/107* (2013.01)

(58) Field of Classification Search
USPC ........................................................ 174/251
See application file for complete search history.

(56) References Cited

U.S. PATENT DOCUMENTS

| | | |
|---|---|---|
| 2008/0149376 A1 | 6/2008 | Saito |
| 2012/0279764 A1 | 11/2012 | Jiang et al. |
| 2014/0048312 A1 | 2/2014 | Kato et al. |
| 2014/0066560 A1 | 3/2014 | Stoppelmann et al. |
| 2014/0292449 A1 | 10/2014 | Kato et al. |
| 2015/0244066 A1 | 8/2015 | Takano et al. |

FOREIGN PATENT DOCUMENTS

| | | |
|---|---|---|
| JP | 2002-100842 A | 4/2002 |
| JP | 2003-069239 A | 3/2003 |
| JP | 2006-348298 A | 12/2006 |
| JP | 2008-160750 A | 7/2008 |
| JP | 2011-061059 A | 3/2011 |
| JP | 4962660 B2 | 6/2012 |
| JP | 2013-544296 A | 12/2013 |
| JP | 2014-043549 A | 3/2014 |
| WO | 2013/103130 A1 | 7/2013 |
| WO | 2014/042070 A1 | 3/2014 |

OTHER PUBLICATIONS

Official Communication issued in International Patent Application No. PCT/JP2015/073470, dated Oct. 13, 2015.
Official Communication issued in corresponding Japanese Patent Application No. 2016-545480, dated Sep. 5, 2017.

* cited by examiner

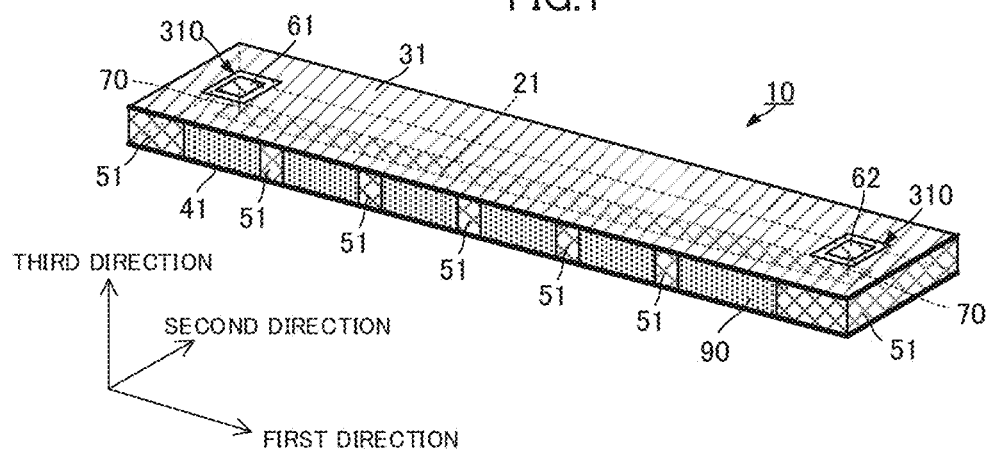

MULTILAYER CIRCUIT BOARD USING LASER DIRECT STRUCTURING ADDITIVE

CROSS REFERENCE TO RELATED APPLICATIONS

This application claims the benefit of priority to Japanese Patent Application No. 2014-175600 filed on Aug. 29, 2014, Japanese Patent Application No. 2014-245316 filed on Dec. 3, 2014 and Japanese Patent Application No. 2015-042598 filed on Mar. 4, 2015 and is a Continuation Application of PCT Application No. PCT/JP2015/073470 filed on Aug. 21, 2015. The entire contents of each application are hereby incorporated herein by reference.

BACKGROUND OF THE INVENTION

1. Field of the Invention

The present invention relates to a multilayer circuit board that is a laminate including a plurality of insulating substrates and conductive patterns, and a method for manufacturing the multilayer circuit board.

2. Description of the Related Art

A signal line utilizing a multilayer circuit board is practically used for transmitting a high-frequency signal. For example, JP 4962660 B1 discloses a structure in which a laminate formed by stacking insulating substrates is provided, and a signal conductor and ground conductors are formed on the laminate.

According to the signal line of JP 4962660 B1, the signal conductor is disposed at an intermediate position in the lamination direction. Two ground conductors are disposed at positions to sandwich the signal conductor in the lamination direction. The two ground conductors are provided in the laminate, and are connected with each other through an interlayer connection conductor extending in the lamination direction.

According to the conventional signal line, however, it is not easy to form a conductive pattern, for example, on a side surface parallel to a lamination direction of the laminate, i.e., a surface other than the surfaces along the main surface of the insulating substrate. Particularly, it is not easy to form a complicated conductive pattern on such surfaces. In addition, as a conductive pattern provided at each part of the laminate becomes finer and more complicated, it becomes difficult to form a desired conductive pattern.

SUMMARY OF THE INVENTION

Preferred embodiments of the present invention provide a method for manufacturing a multilayer circuit board that is able to reliably form a desired conductive pattern, and also provide a multilayer circuit board.

A method for manufacturing a multilayer circuit board according to a preferred embodiment of the present invention, includes the steps of patterning a conductor adhered to an insulating substrate to provide a first conductive pattern, stacking a plurality of insulating substrates, including the insulating substrate on which the first conductive pattern is provided, to form a laminate with at least a portion of the first conductive pattern provided inside the laminate, and providing a second conductive pattern on an outer surface of the laminate. The step of providing the second conductive pattern includes the steps of adding a Laser Direct Structuring additive, which includes properties that change upon laser irradiation, to the insulating substrates, and patterning a surface of a portion to which the Laser Direct Structuring additive is added with laser irradiation, and plating a patterned area with a conductor.

By applying the laser irradiation to provide a conductive pattern, the method described above is able to form a variety of conductive patterns on a laminate.

A method for manufacturing a multilayer circuit board according to another preferred embodiment of the present invention includes the steps of providing a first conductive pattern on an insulating substrate, stacking a plurality of insulating substrates, including the insulating substrate on which the first conductive pattern is provided, to form a laminate with at least a portion of the first conductive pattern provided inside the laminate, and providing a second conductive pattern on an outer surface of the laminate. Each of the steps of providing the first conductive pattern and the second conductive pattern includes the steps of adding a Laser Direct Structuring additive, which includes properties that change upon laser irradiation, to the insulating substrates, and patterning a surface of a portion to which the Laser Direct Structuring additive is added with laser irradiation, and plating a patterned area with a conductor.

In a method for manufacturing the multilayer circuit board according to a preferred embodiment of the present invention, preferably the plurality of insulating substrates are thermoplastic materials. The step of forming the laminate preferably includes a step of stacking and then thermally crimping the insulating substrates.

According to the method described above, the laminate is able to be integrally formed.

In a method for manufacturing the multilayer circuit board according to a preferred embodiment of the present invention, preferably the step of providing the second conductive pattern includes the steps of applying a Laser Direct Structuring additive, which includes properties that change upon laser irradiation, to the laminate, and patterning a surface of the laminate on which the Laser Direct Structuring additive is applied with laser irradiation, and plating a patterned area with a conductor.

In a method for manufacturing the multilayer circuit board according to a preferred embodiment of the present invention, preferably the insulating substrates include an insulating substrate containing a Laser Direct Structuring additive, which includes properties that change upon laser irradiation. The step of providing the second conductive pattern preferably includes a step of patterning a surface of the laminate formed of the insulating substrates containing the Laser Direct Structuring additive with laser irradiation, and plating a patterned area with a conductor.

According to various preferred embodiments of the present invention, fine and complicated conductive patterns are able to be formed.

A multilayer circuit board according to another preferred embodiment of the present invention includes a laminate in which a plurality of insulating substrates are stacked, a third conductive pattern on a main surface of one of the insulating substrates, and a fourth conductive pattern on an outer surface of the laminate. The third conductive pattern is a conductive pattern defined by patterning a conductor adhered to the insulating substrates. The fourth conductive pattern is a conductive pattern defined by plating an area where the Laser Direct Structuring additive is irradiated with laser light.

A multilayer circuit board according to another preferred embodiment of the present invention includes a laminate in which a plurality of insulating substrates are stacked, an inner conductive pattern inside the laminate, and an outer surface conductive pattern on an outer surface of the laminate. Each of the inner conductive pattern and the outer surface conductive pattern is a conductive pattern defined by a plated material in an area including an irradiated Laser Direct Structuring additive.

According to various preferred embodiments of the present invention, a multilayer circuit board is able to include a variety of conductive patterns.

In a multilayer circuit board according to a preferred embodiment of the present invention, the third conductive pattern and the fourth conductive pattern are connected with each other. Alternatively, in the multilayer circuit board according to a preferred embodiment of the present invention, the inner conductive pattern and the outer surface conductive pattern are connected with each other.

A multilayer circuit board according to a preferred embodiment of the present invention may include the following configuration. A portion of the inner conductive pattern is located at a position different from the other portion in a lamination direction of the laminate.

The configuration described above provides a multilayer circuit board with a low transmission loss that is easily installed.

A multilayer circuit board according to a preferred embodiment of the present invention preferably includes the fourth conductive pattern on a side surface in the lamination direction of the laminate, and at least one hole provided on the side surface in an area where the fourth conductive pattern is not provided.

A multilayer circuit board according to a preferred embodiment of the present invention preferably includes the outer surface conductive pattern provided on a side surface in the lamination direction of the laminate, and at least one hole provided in the side surface at an area where the outer surface conductive pattern is not formed.

Since the side surfaces of the laminate include at least one hole according to a preferred embodiment of the present invention, a multilayer circuit board with good flexibility, while maintaining sufficient strength is able to be provided.

The at least one hole preferably includes a plurality of holes, and the holes are preferably located at regular intervals in an extending direction of the laminate, for example.

Accordingly, the entire multilayer circuit board is able to be flexible in the extending direction of the laminate.

In a multilayer circuit board according to a preferred embodiment of the present invention, the laminate of the multilayer circuit board preferably includes at least one insulating substrate including a step, and a conductor provided on a surface on which the step is provided. The conductor, which is provided on the surface including the step, is a conductive pattern defined by a plated material in an area including an irradiated Laser Direct Structuring additive.

According to the configuration described above, a desired conductive pattern is able to be reliably provided even when the laminate includes a step.

According to various preferred embodiments of the invention, a desired conductive pattern is able to be reliably provided on the laminate.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is an external perspective view of a multilayer circuit board according to a first preferred embodiment of the present invention.

DETAILED DESCRIPTION OF THE INVENTION

Figure 2A:
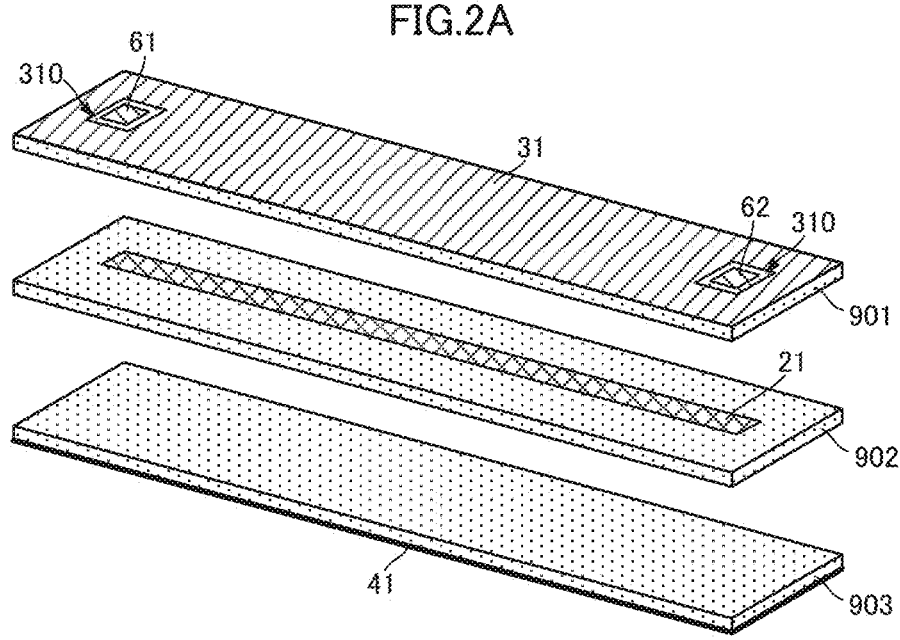
FIGS. 2A-2C are perspective views each showing the multilayer circuit board at each manufacturing step according to the first preferred embodiment of the present invention.

Preferred embodiments of the present invention are described below with specific examples with reference to the drawings. In the drawings, components assigned with the same reference numerals will represent identical or substantially identical components. Each of the preferred embodiments is illustrative and the configurations shown in different preferred embodiments are able to be partially replaced or combined with each other.

First Preferred Embodiment

Figure 2B:
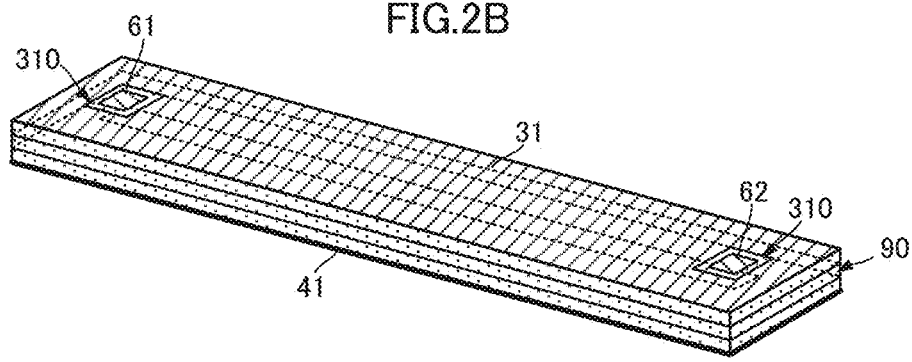
Figure 2C:
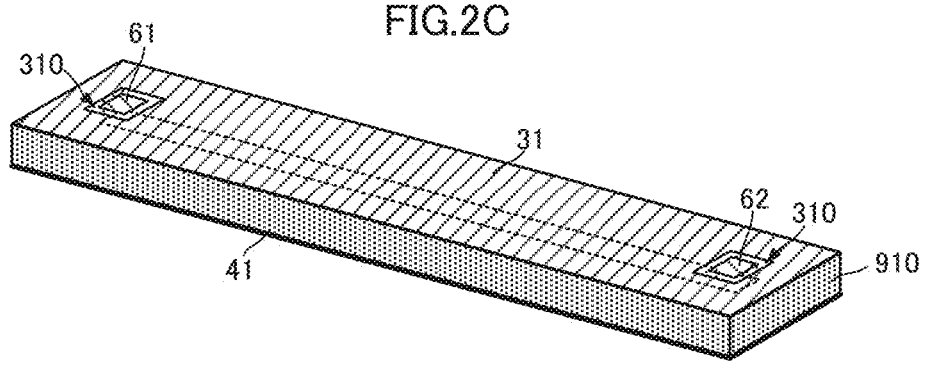
Figure 3:
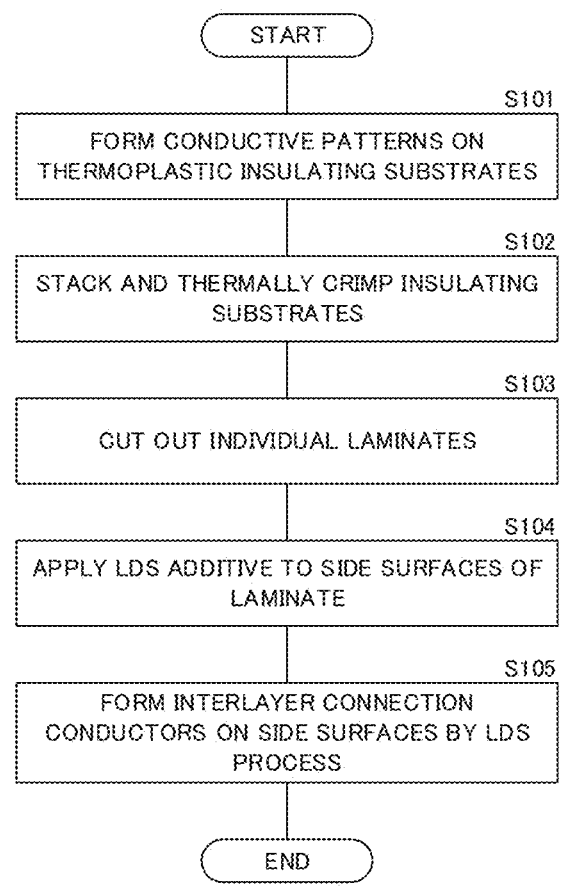
FIG. 3 is a flowchart of manufacturing the multilayer circuit board according to the first preferred embodiment of the present invention.

A multilayer circuit board according to a first preferred embodiment of the present invention is described below with reference to the drawings. FIG. 1 is an external perspective view of the multilayer circuit board according to the first preferred embodiment. FIGS. 2A-2C are perspective views each showing the multilayer circuit board at each manufacturing step according to the first preferred embodiment. FIG. 3 is a flowchart of manufacturing the multilayer circuit board according to the first preferred embodiment.

Referring to FIG. 1, a multilayer circuit board 10 includes a signal conductor 21, a first ground conductor 31, a second ground conductor 41, interlayer connection conductors 51, 70, external connection terminals 61, 62, and a laminate 90. With the structure described above, the multilayer circuit board 10 provides a high frequency signal transmission line.

According to the first preferred embodiment, each of the signal conductor 21, the first ground conductor 31, the second ground conductor 41, and the external connection terminals 61, 62 corresponds to a "first conductive pattern", each of the interlayer connection conductors 51 corresponds to a "second conductive pattern". Each of the first ground conductor 31 and the second ground conductor 41 also corresponds to a "third conductive pattern", and each of the interlayer connection conductors 51 also corresponds to a "fourth conductive pattern".

The laminate 90 is a long flat plate extending in a signal transmission direction (first direction). Referring to FIGS. 2A-2C, the laminate 90 is formed preferably by stacking and thermally crimping the insulating substrates 901, 902, 903. Each of the insulating substrates 901, 902, 903 is formed of a thermoplastic resin including a liquid crystal polymer.

The signal conductor 21 is located at an intermediate position in a thickness direction (third direction) of the laminate 90, i.e., a direction in which the insulating substrates 901, 902, 903 are stacked. The signal conductor 21 includes an elongated shape extending in a direction in which the laminate 90 extends (first direction). The signal conductor 21 is located in the middle or substantially in the middle of the width direction (second direction) of the laminate 90.

The first ground conductor 31 is located on an end surface (main surface) of one end in the thickness direction (third direction) of the laminate 90. The first ground conductor 31 is located on an entire or substantially an entire surface of the end surface of one end of the laminate 90. Openings 310 are provided in the first ground conductor 31 at areas overlapping with both ends in the extending direction of the signal conductor 21 in a plan view of the laminate 90. The external connection terminals 61, 62 are located in the openings 310, respectively.

The second ground conductor 41 is located on an end surface (main surface) of the other end in the thickness direction (third direction) of the laminate 90. The second ground conductor 41 is located on an entire or substantially an entire surface of the end surface of the other end of the laminate 90.

The signal conductor 21, the first ground conductor 31, and the second ground conductor 41 are formed preferably by patterning conductors adhered on the main surfaces of the insulating substrates 901, 902, 903 by etching or the like.

The interlayer connection conductors 51 are provided on the side surfaces of the laminate 90. One of the interlayer connection conductors 51 is provided on an entire or substantially an entire surface of the side surface on each end of the laminate 90 in the first direction. The interlayer connection conductors 51 are arranged in the first direction at predetermined intervals on an entire or substantially an entire surface of the side surface on each end of the laminate 90 in the second direction. The intervals of the interlayer connection conductors 51 may be set according to the spurious characteristics of a high-frequency signal transmitted through the multilayer circuit board 10. That the interlayer connection conductors 51 may be located on the entire or substantially entire surface of the side surface on each end of the laminate 90 in the second direction, for example. As described above, the interlayer connection conductors 51 are located on each side surface of the laminate 90, and thus a clearance between the interlayer connection conductors at ground potential and the signal conductor 21 is able to be increased as compared to a structure in which the interlayer connection conductor is formed inside the laminate 90. Accordingly, the width of the multilayer circuit board 10 in the second direction is able to be reduced while maintaining a large clearance between the interlayer connection conductors 51 and the signal conductor 21, as compared to a structure in which the interlayer connection conductor is provided inside the laminate 90.

The interlayer connection conductors 51 are formed preferably by applying a Laser Direct Structuring additive (LDS additive), which includes properties that change upon laser irradiation, to a surface of the laminate 90, then patterning the applied film with laser irradiation, and then performing a patterning processing to form a conductive pattern by plating.

The interlayer connection conductors 70 are provided in the laminate 90. Each of the interlayer connection conductors 70 includes a shape extending in the lamination direction. The interlayer connection conductors 70 connect a first end in the extending direction of the signal conductor 21 and the external connection terminal 61, and connect a second end in the extending direction of the signal conductor 21 and the external connection terminal 62.

Each of the interlayer connection conductors 70 is formed preferably by providing a hole in the insulating substrates, which forms the laminate 90, filling the hole with a conductive paste, and solidifying the paste when the insulating substrates are thermally crimped.

In the structure described above, a conductive pattern is formed preferably by applying the laser direct structuring process (LDS process), with respect to a portion at which a patterning process is not able to be easily performed, by etching a conductor. Accordingly, the multilayer circuit board 10 is able to include a variety of conductive patterns.

The multilayer circuit board 10 is manufactured by the processes described below with respect to FIGS. 2A, 2B, 2C, and 3.

First, single-sided copper-clad thermoplastic insulating substrates 901, 902, 903 are provided. Then, a patterning processing by etching and the like is performed on portions of the insulating substrates 901, 902, 903 to form the signal conductor 21, the first ground conductor 31, the second ground conductor 41, the external connection terminals 61, 62 on the insulating substrates 901, 902, 903 as shown in FIG. 2A (S101). Through holes are formed in the insulating substrate 901 at positions where the interlayer connection conductors 70 are to be formed, and are filled with a conductive paste (not shown in FIG. 2A). At this stage, each of the insulating substrates 901, 902, 903 is an insulating sheet including a size that is able to form a plurality of the multilayer circuit boards 10.

Next, the plurality of insulating substrates 901, 902, 903 are stacked and thermally crimped (S102). The conductive paste is solidified to form the interlayer connection conductors 70 (not shown in FIG. 2A).

Then, individual pieces of the laminates 90 are cut out (S103). Accordingly, the laminate 90 as shown in FIG. 2B is formed.

Referring to FIG. 2C, a laser direct structuring additive (LDS additive) 910 is applied on the side surfaces of the laminate 90 (S104).

Then, the side surfaces of the laminate 90, on which the LDS additive 910 is applied, are irradiated with laser light to roughen areas where conductors are to be formed. Then, the roughened areas on the side surfaces are plated to form conductive patterns (S105). Accordingly, the interlayer connection conductors 51 are formed as shown in FIG. 1.

Accordingly, a conductive pattern extending in the lamination direction is able to be easily formed on the side surfaces of the laminate where a conductor is not able to be easily formed by etching. Accordingly, a variety of conductive patterns and an enlargement of an area where the conductive patterns are able to be provided in the laminate. In addition, unlike a simple plating treatment, a conductive pattern is able to be formed accurately at a position at which the conductive pattern is to be formed. As a result, a multilayer circuit board including a variety of conductive patterns compared to a conventional board is able to be reliably and accurately formed. Since the LDS additive is not applied to or included in the inside of the multilayer circuit board, characteristic degradation caused by the multilayer circuit board including a different material is able to be significantly reduced or prevented.

Second Preferred Embodiment

Figure 4:
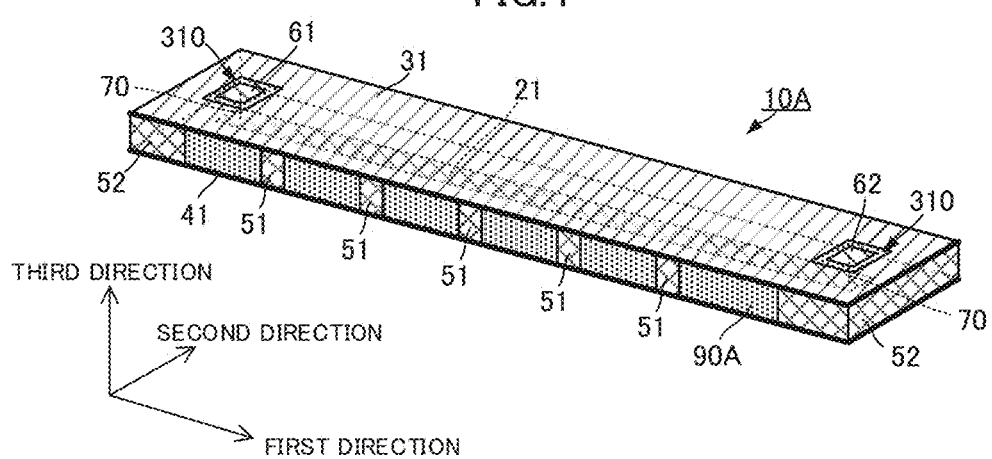
FIG. 4 is an external perspective view of a multilayer circuit board of a second preferred embodiment of the present invention.
Figure 5A:
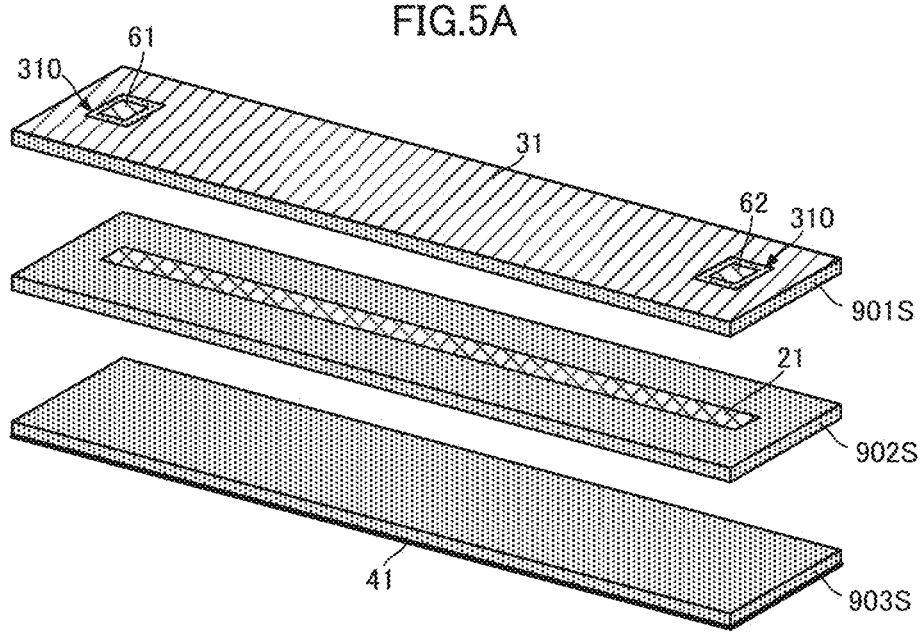
FIGS. 5A and 5B are perspective views each showing the multilayer circuit board at each manufacturing step according to the second preferred embodiment of the present invention.
Figure 5B:
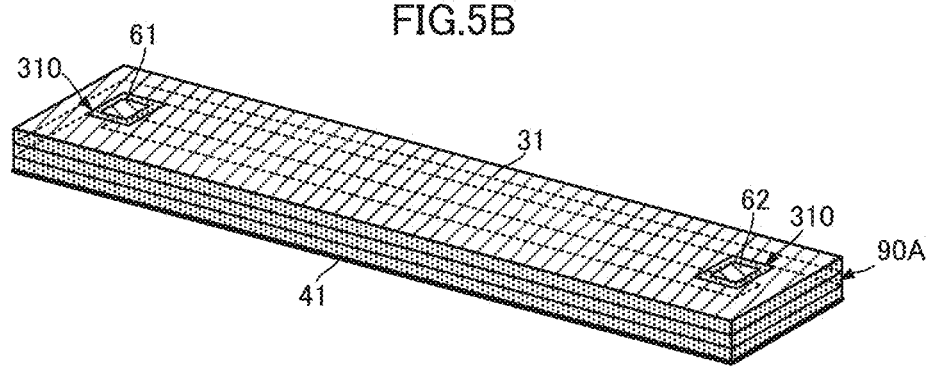
Figure 6:
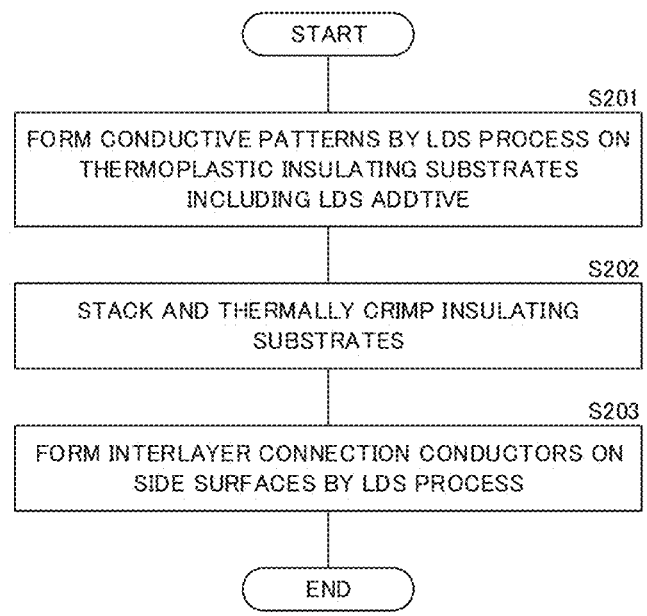
FIG. 6 is a flowchart of manufacturing the multilayer circuit board according to the second preferred embodiment of the present invention.

A multilayer circuit board and a method for manufacturing the multilayer circuit board according to a second preferred embodiment of the present invention are described below with reference to the drawings. FIG. 4 is an external perspective view of the multilayer circuit board according to the second preferred embodiment. FIGS. 5A and 5B are perspective views each showing the multilayer circuit board at each manufacturing step according to the second preferred embodiment. FIG. 6 is a flowchart of manufacturing the multilayer circuit board according to the second preferred embodiment.

A multilayer circuit board 10A according to the second preferred embodiment differs from the multilayer circuit board 10 according to the first preferred embodiment in the composition of insulating substrates 901S, 912S, 903S included in a laminate 90A. The other components are the same as or similar to those of the multilayer circuit board 10 according to the first preferred embodiment. According to the structure described above, a manufacturing method of the multilayer circuit board 10A is different from that of the multilayer circuit board 10 according to the first preferred embodiment.

Referring to FIGS. 4, 5A, and 5B, the multilayer circuit board 10A according to the second preferred embodiment includes the laminate 90A formed by stacking and thermally crimping the insulating substrates 901S, 902S, 903S. Each of the insulating substrates 901S, 902S, 903S is formed of a thermoplastic resin to which the LDS additive is added.

In the structure described above, a signal conductor 21, a first ground conductor 31, a second ground conductor 41, and external connection terminal 61, 62 are able to also be manufactured by the LDS process. Accordingly, a conductive pattern is able to be reliably and accurately formed even when a pattern with a complicated and fine geometry is provided for the signal conductor 21, for example.

According to the second preferred embodiment, the signal conductor 21 corresponds to an "inner conductive pattern", the external connection terminals 61, 62 each correspond to an "outer surface conductive pattern".

The multilayer circuit board 10A is manufactured by the processes described below with respect to see FIGS. 5A, 5B, and 6.

First, the thermoplastic insulating substrates 901S, 902S, 903S, each of which includes the LDS additive, are provided. Then, a patterning processing by the LDS process and the like is performed on portions of the insulating substrates 901S, 902S, 903S to form the signal conductor 21, the first ground conductor 31, the second ground conductor 41, the external connection terminals 61, 62 on the insulating substrates 901S, 902S, 903S as shown in FIG. 5A (S201). Through holes are formed in the insulating substrate 901S at positions where interlayer connection conductors 70 are to be formed, and are filled with a conductive paste (not shown in FIG. 5A). Each of the insulating substrates 901S, 902S, 903S may be an insulating sheet including a size that is able to form a plurality of multilayer circuit boards 10A or may be divided into individual pieces of laminates.

Next, the plurality of insulating substrates 901S, 902S, 903S are stacked and thermally crimped (S202). The conductive paste is solidified to form the interlayer connection conductors (not shown in FIG. 5A).

Referring to FIG. 5B, conductive patterns are formed on the side surfaces of the laminate 90A by the LDS process (S203). Accordingly, the interlayer connection conductors 51 are formed as shown in FIG. 4.

According to the manufacturing method described above, all of the conductive patterns are able to be formed by the LDS process on both of the outer surface and the inner surface of the laminate. Accordingly, the patterning processing of the conductors is able to be uniform in the manufacturing method according to the second preferred embodiment, and the conductive patterns are able to be more freely formed while simplifying the processes.

Third Preferred Embodiment

Figure 7:
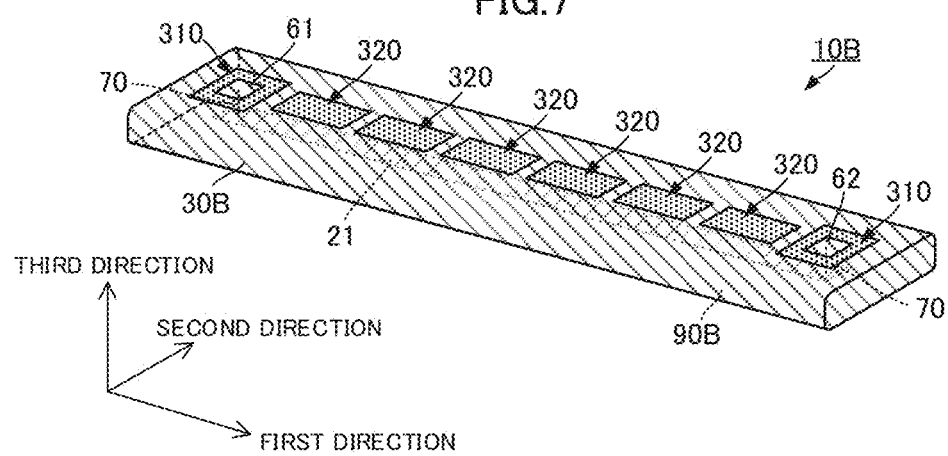
FIG. 7 is an external perspective view of a multilayer circuit board of a third preferred embodiment of the present invention.
Figure 8A:
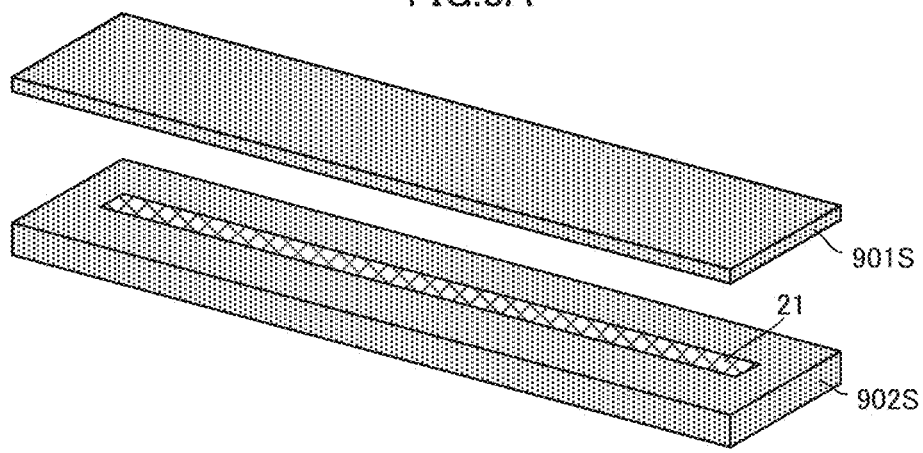
FIGS. 8A and 8B are perspective views each showing the multilayer circuit board at each manufacturing step according to the third preferred embodiment of the present invention.
Figure 8B:
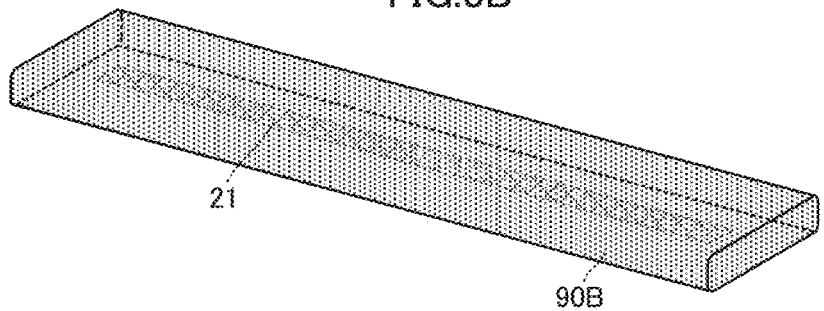

A multilayer circuit board and a method for manufacturing the multilayer circuit board according to a third preferred embodiment of the present invention are described below with reference to the drawings. FIG. 7 is an external perspective view of the multilayer circuit board according to the third preferred embodiment. FIGS. 8A and 8B are perspective views each showing the multilayer circuit board at each manufacturing step according to the third preferred embodiment.

A multilayer circuit board 10B according to the third preferred embodiment differs from the multilayer circuit board 10A according to the second preferred embodiment in a laminate 90B and a ground conductor 30B. The other components are the same as or similar to those of the multilayer circuit board 10A according to the second preferred embodiment.

According to the third preferred embodiment, a signal conductor 21 corresponds to an "inner conductive pattern", and external connection terminals 61, 62 each correspond to an "outer surface conductive pattern".

Referring to FIG. 7, the multilayer circuit board 10B according to the third preferred embodiment includes laminate 90B formed by stacking and thermally crimping insulating substrates 901S, 902S. Each of the insulating substrates 901S, 902S is formed of a thermoplastic resin to which the LDS additive is added. A cross section of the laminate 90B orthogonal or substantially orthogonal to the extending direction includes a rectangular or substantially rectangular shape with curved corners including predetermined curvatures.

The ground conductor 30B is formed on an entire or substantially an entire surface of the outer surface of the laminate 90B. A plurality of openings 320 are provided in the ground conductor 30B on an end surface of one end in the lamination direction of the laminate 90B.

The ground conductor 30B is formed by the LDS process. By applying the LDS process, conductive patterns are able to be reliably and accurately formed even on a three-dimensional area, for example, the entire or substantially entire surface of the laminate 90B. Particularly, as illustrated in the laminate 90B according to the third preferred embodiment, a conductive pattern is able to be reliably formed even on a curved face by applying the LDS process.

The structure of the third preferred embodiment is able to significantly reduce or prevent concentration of the electric field at the corners of the laminate thus significantly reducing or preventing a transmission loss. Accordingly, a transmission line with a low transmission loss is able to be reliably and easily manufactured by the manufacturing method according to the third preferred embodiment.

Fourth Preferred Embodiment

Figure 9:
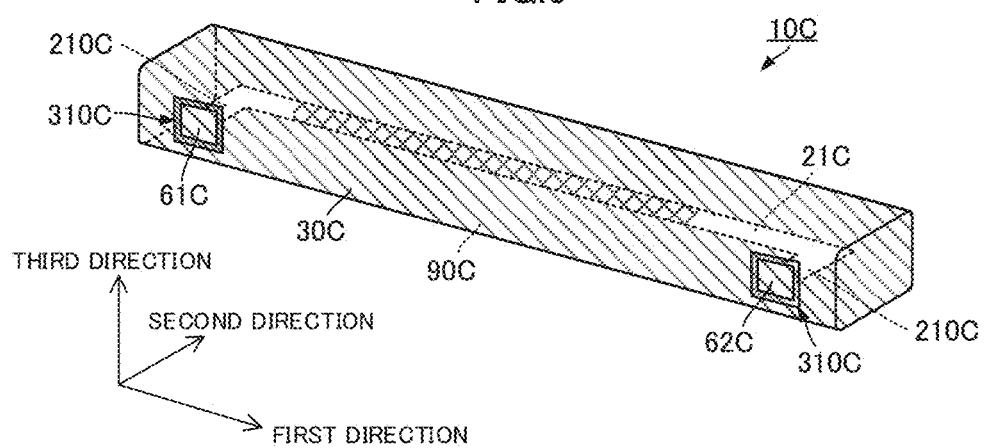
FIG. 9 is an external perspective view of a multilayer circuit board of a fourth preferred embodiment of the present invention.

A multilayer circuit board and a method for manufacturing the multilayer circuit board according to a fourth preferred embodiment of the present invention are described below with reference to the drawings. FIG. 9 is an external perspective view of the multilayer circuit board according to the fourth preferred embodiment.

A multilayer circuit board 10C according to the fourth preferred embodiment differs from the multilayer circuit board 10B according to the third preferred embodiment in the structures of a signal conductor 21C, a ground conductor 30C, and external connection terminals 61C, 62C. The other components are the same as or similar to those of the multilayer circuit board 10B according to the third preferred embodiment.

Both ends in the extending direction of the signal conductor 21C are connected with leading conductors 210C, respectively. An extending direction of each of the leading conductors 210C is orthogonal or substantially orthogonal to the lamination direction, and also orthogonal or substantially orthogonal to the extending direction of the signal conductor 21C. The end of each of the leading conductors 210C opposite to the end connected with the signal conductor 21C is exposed to a side surface of the laminate 90C (a side surface parallel or substantially parallel to the longitudinal direction). More specifically, the end of each of the leading conductors 210C is exposed to a surface that is parallel or substantially parallel to the longitudinal direction and extends along the lamination direction.

The ground conductor 30C is formed on an entire or substantially an entire surface of the outer surface of the laminate 90C. The external connection terminals 61C, 62C are formed on the side surface of the laminate 90C, to which the leading conductors 210C are exposed, to include the exposed areas of the leading conductors 210C. Each of the external connection terminals 61C, 62C is separated from the ground conductor 30C by an opening 310C.

The ground conductor 30C and the external connection terminals 61C, 62C are formed by the LDS process. The signal conductor 21C and the leading conductors 210C may be formed by either of the LDS process or a patterning process by etching.

According to the fourth preferred embodiment, the signal conductor 21C corresponds to a "third conductive pattern", and each of the external connection terminals 61C, 62C corresponds to a "fourth conductive pattern". Each of the leading conductors 210C corresponds to an "inner conductive pattern" and each of the external connection terminals 61C, 62C corresponds to an "outer surface conductive pattern".

As described above, by applying the LDS process, a conductive pattern is able to be easily formed on the side surface of the laminate 90C even in an elongated shape in the lamination direction. According to the structure described above, it is not necessary to form an interlayer connection conductor with a conductive paste in the laminate 90C. Accordingly, the leading conductors 210C that lead the signal conductor 21C to the outer surface are able to be easily formed. In addition, a resistance value at this portion is able to be lowered, and thus the transmission loss is able to be further reduced or prevented.

Fifth Preferred Embodiment

Figure 10:
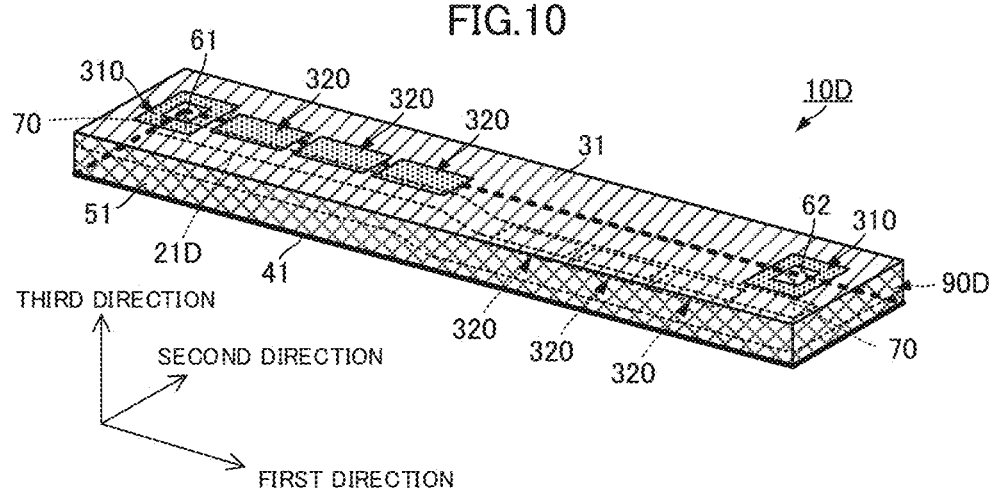
FIG. 10 is an external perspective view of a multilayer circuit board of a fifth preferred embodiment of the present invention.
Figure 11:
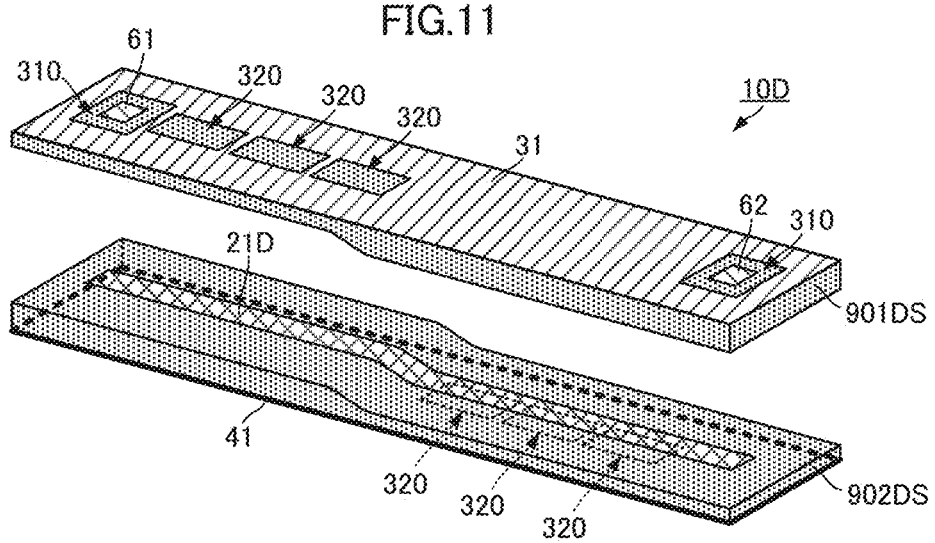
FIG. 11 is a perspective view showing the multilayer circuit board at each manufacturing step according to the fifth preferred embodiment of the present invention.

A multilayer circuit board according to a fifth preferred embodiment of the present invention is described below with reference to the drawings. FIG. 10 is an external perspective view of the multilayer circuit board according to the fifth preferred embodiment. FIG. 11 is a perspective view showing the multilayer circuit board at each manufacturing step according to the fifth preferred embodiment.

A multilayer circuit board 10D according to the fifth preferred embodiment differs from the multilayer circuit boards according to the first, second, and third preferred embodiments in that a signal conductor 21D includes a portion curved in the lamination direction. Other components of the multilayer circuit board are the same as or similar to those of the multilayer circuit boards according to the first, second, and third preferred embodiments.

Referring to FIG. 10, the multilayer circuit board 10D includes the signal conductor 21D, a first ground conductor 31, a second ground conductor 41, an interlayer connection conductor 51, external connection terminals 61, 62, and a laminate 90D.

According to the fifth preferred embodiment, the signal conductor 21D corresponds to an "inner conductive pattern" and each of the external connection terminals 61, 62 corresponds to an "outer surface conductive pattern".

Referring to FIG. 11, the laminate 90D is formed by stacking and thermally crimping insulating substrates 901DS, 902DS. Each of the insulating substrates 901DS, 902DS is formed of a thermoplastic resin including a liquid crystal polymer. The LDS additive is added to the insulating substrates 901DS, 902DS. Each of the insulating substrates 901DS, 902DS includes a shape in which the thickness thereof changes in an intermediate portion in the longitudinal direction to include a thicker portion and a thinner portion. The thicker portion of the insulating substrate 901DS overlies the thinner portion of the insulating substrate 902DS, the thinner portion of the insulating substrate 901DS overlies the thicker portion of the insulating substrate 902DS. With the structure described above, the laminate 90D as a whole includes a shape including a constant or substantially constant thickness.

The signal conductor 21D is located at an intermediate position in the thickness direction (third direction) of the laminate 90D. The signal conductor 21D includes an elongated shape extending in a direction in which the laminate 90 extends. The signal conductor 21D is located at the middle or substantially at the middle of the width direction (second direction) of the laminate 90D. The signal conductor 21D is curved in the thickness direction (lamination direction) of the laminate 90D at an intermediate position in the extending direction. Accordingly, areas of a first end and a second end in the extending direction of the signal conductor 21D are positioned differently from each other in the thickness direction (third direction) of the laminate 90D.

The first ground conductor 31 is located on an end surface of one end in the thickness direction (third direction) of the laminate 90D. The first ground conductor 31 is located on an entire or substantially an entire surface of the end surface of one end of the laminate 90D. Openings 310 are provided in the first ground conductor 31 at areas overlapping with both ends in the extending direction of the signal conductor 21 in a plan view of the laminate 90D. The external connection terminals 61, 62 are located in the openings 310, respectively. The first ground conductor 31 includes a plurality of openings 320 in an area overlapping with the signal conductor 21D where the signal conductor 21D extends nearer to the first ground conductor 31.

The second ground conductor 41 is located on an end surface of the other end in the thickness direction (third direction) of the laminate 90D. The second ground conductor 41 is located on an entire or substantially an entire surface of the end surface of the other end of the laminate 90D.

The second ground conductor 41 includes a plurality of openings 320 in an area overlapping with the signal conductor 21D where the signal conductor 21D extends nearer to the second ground conductor 41.

The interlayer connection conductor 51 is located on the side surfaces of the laminate 90D.

The configuration described above is able to provide a laminate including a structure in which the position of the signal conductor is able to be changed in the thickness direction (third direction) of the laminate. Accordingly, a positional relationship between the signal conductor and the ground conductor and a shape of a transmission line are able to provide easy installation of the multilayer circuit board.

In addition, the configuration described above is able to change the position of a signal conductor in the thickness direction (third direction) with a planar pattern, without including an interlayer connection conductor with a via hole or a through hole being provided in an insulating substrate. Accordingly, a conductor loss as a transmission line is able to be significantly reduced or prevented. As a result, a transmission line with a suitable shape and a low transmission loss is able to be easily formed.

The multilayer circuit board 10D with the configuration described above is manufactured in the processes described below with respect to FIG. 11.

First, thermoplastic insulating substrates 901DS, 902DS, each including an LDS additive are provided. Then, a patterning processing by the LDS process and the like is performed on portions of the insulating substrates 901DS, 902DS to form the signal conductor 21D, the first ground conductor 31, the second ground conductor 41, the external connection terminals 61, 62 on the insulating substrates 901DS, 902DS as shown in FIG. 11.

Next, the insulating substrates 901DS, 902DS are stacked and thermally crimped. Then, the interlayer connection conductor 51 is formed on the side surfaces of the laminate 90D by the LDS process.

The manufacturing method described above provides easy formation of the signal conductor 21D in a shape curved in the thickness direction (third direction) of the laminate 90D at an intermediate position in the extending direction. In other words, a conductive pattern is able to be easily manufactured even in a complicated shape.

Sixth Preferred Embodiment

Figure 12:
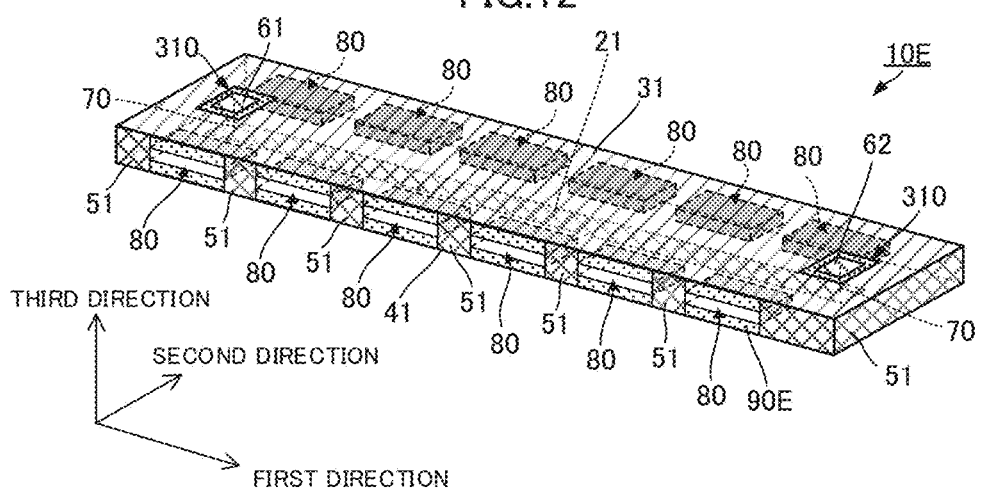
FIG. 12 is an external perspective view of a multilayer circuit board according to a sixth preferred embodiment of the present invention.
Figure 13:
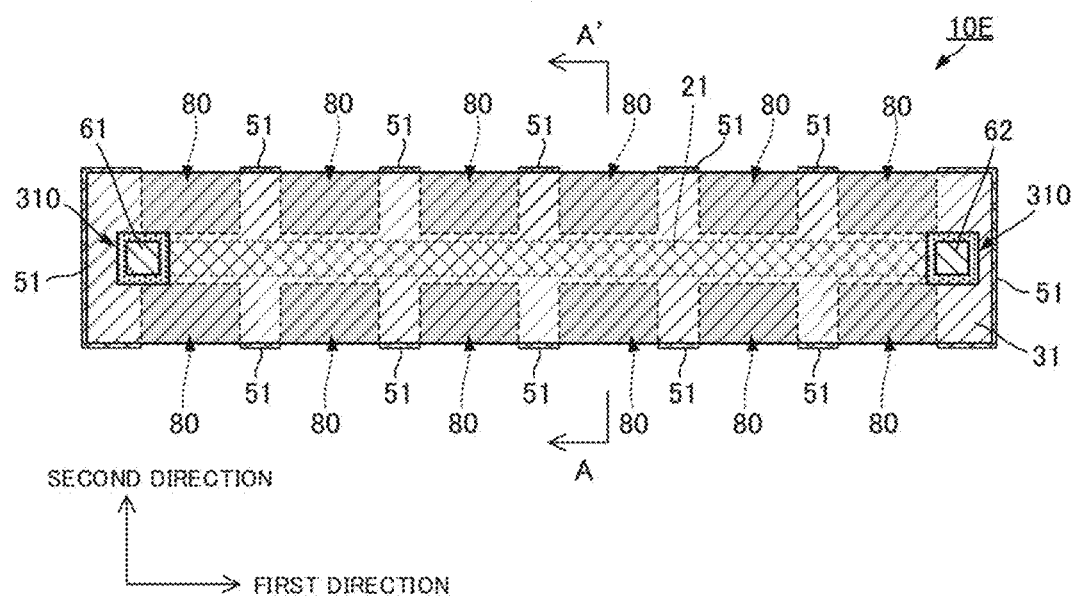
FIG. 13 is a plan view of the multilayer circuit board according to the sixth preferred embodiment of the present invention.
Figure 14:
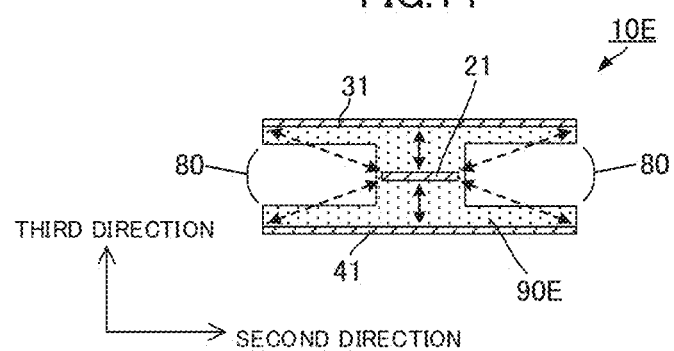
FIG. 14 is a cross section of the multilayer circuit board according to the sixth preferred embodiment of the present invention taken along line A-A' in FIG. 13.
Figure 15:
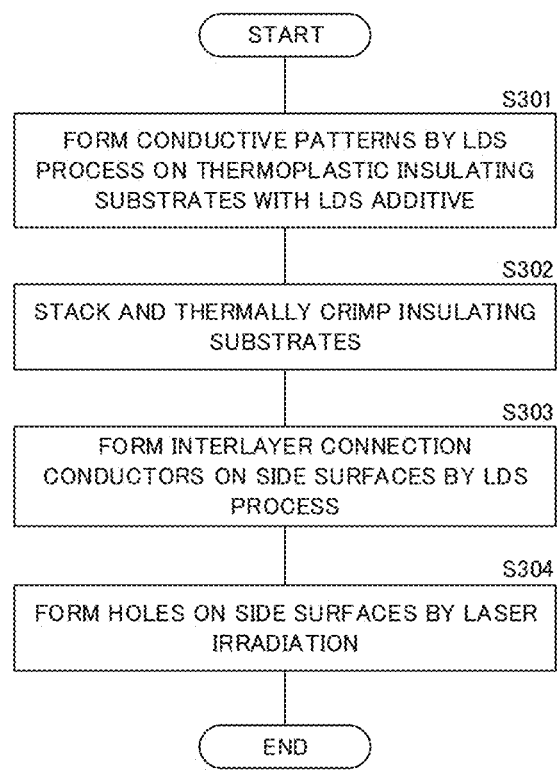
FIG. 15 is a flowchart of manufacturing the multilayer circuit board according to the sixth preferred embodiment of the present invention.

A multilayer circuit board according to a sixth preferred embodiment of the present invention is described below with reference to the drawings. FIG. 12 is an external perspective view of the multilayer circuit board according to the sixth preferred embodiment. FIG. 13 is a plan view of the multilayer circuit board according to the sixth preferred embodiment. FIG. 14 is a cross section of the multilayer circuit board according to the sixth preferred embodiment taken along line A-A' in FIG. 13. FIG. 15 is a flowchart of manufacturing the multilayer circuit board according to the sixth preferred embodiment.

A multilayer circuit board 10E according to the sixth preferred embodiment differs from the multilayer circuit board according to the first preferred embodiment in that holes 80 are provided on the side surfaces of the laminate. Other components of the multilayer circuit board are the same as or similar to those of the multilayer circuit boards according to the first preferred embodiment.

More specifically, according to the sixth preferred embodiment, each of a signal conductor 21, a first ground conductor 31, a second ground conductor 41, and external connection terminals 61, 62 corresponds to a "first conductive pattern", and each of interlayer connection conductors 51 corresponds to a "second conductive pattern". Each of the first ground conductor 31 and the second ground conductor 41 also corresponds to a "third conductive pattern", and each of the interlayer connection conductors 51 also corresponds to a "fourth conductive pattern".

Referring to FIGS. 12 and 13, a laminate 90E is a long flat plate extending in an extending direction (first direction) of the signal conductor 21. In the multilayer circuit board 10E, the interlayer connection conductors 51 are arranged on the side surfaces in the lamination direction of the laminate 90E (side surfaces in the second direction), and the holes 80 are provided on the side surfaces of the laminate 90E in an area where the conductive patterns, for example, the interlayer connection conductors 51 and the external terminals, are not formed. The holes 80 are depressions formed on the side surfaces of the laminate 90E.

According to the configuration described above, a multilayer circuit board with high flexibility is able to be manufactured while maintaining sufficient strength. In addition, the multilayer circuit board 10E includes the holes 80 that are arranged in an extending direction (first direction) of the laminate 90E at regular intervals. Accordingly, the multilayer circuit board is able to be formed with flexibility in the extending direction (first direction) of the laminate 90E.

In addition, the multilayer circuit board 10E according to the sixth preferred embodiment includes the holes 80 on either side in the second direction of the signal conductor 21 in an area between the first ground conductor 31 and the second ground conductor 41, as indicated by the arrows with broken lines in FIG. 14. The holes 80 are not formed in an area where the signal conductor 21 is opposed to the first ground conductor (31) and in an area where the signal conductor 21 is opposed to the second ground conductor (41), as indicated by the arrows without broken lines in FIG. 14.

When transmitting a high-frequency signal, the signal conductor 21 and the first and the second ground conductors (31, 41) are capacitively coupled. Here, the capacitance C is proportional to the dielectric constant, and the dielectric constant of the insulating substrate $\in_r$ is larger than the dielectric constant of air $\in_A$ ($\in_r > \in_A$). Thus, the capacitance Cs between the signal conductor 21 and each of the first and the second ground conductors (31, 41) of the multilayer circuit board 10E according to the sixth preferred embodiment is able to be lowered in comparison with a case where holes are not formed on the side surfaces of the laminate. The capacitance Cs between the signal conductor 21 and each of the first and the second ground conductors (31, 41) is able to be efficiently lowered by providing the holes near both ends of the signal conductor 21 to lower the dielectric constant like in the sixth preferred embodiment, as electric charges are concentrated on both ends of the signal conductor 21 when a high-frequency signal is transmitted.

As described above, the sixth preferred embodiment is able to provide the multilayer circuit board in which the capacitance between the signal conductor 21 and the first ground conductor 31 and the capacitance between the signal conductor 21 and the second ground conductor 41 are lowered.

However, the number, intervals, shapes, depth, arrangement, and the like of the holes 80 are able to be changed as desired. These elements may be set according to the strength and the flexibility of the multilayer circuit board, the intervals between the interlayer connection conductors 51, the capacitance between the signal conductor 21 and the first ground conductor 31, the capacitance between the signal conductor 21 and the second ground conductor 41 and the like.

The multilayer circuit board 10E is manufactured by the processes described below with respect to see FIG. 15.

First, a plurality of thermoplastic insulating substrates each including the LDS additive are provided. Then, a patterning processing by the LDS process is performed on portions of the insulating substrates to form a signal conductor, a first ground conductor, a second ground conductor, external connection terminals and the like on the insulating substrates (S301).

Next, the insulating substrates are stacked and thermally crimped (S302). Then, interlayer connection conductors are formed on the side surface of the laminate by the LDS process (S303).

Then, the holes are formed on the side surfaces by laser irradiation in the width direction (second direction) of the laminate (S304).

The holes are able to be easily formed with the manufacturing method described above.

Seventh Preferred Embodiment

Figure 16:
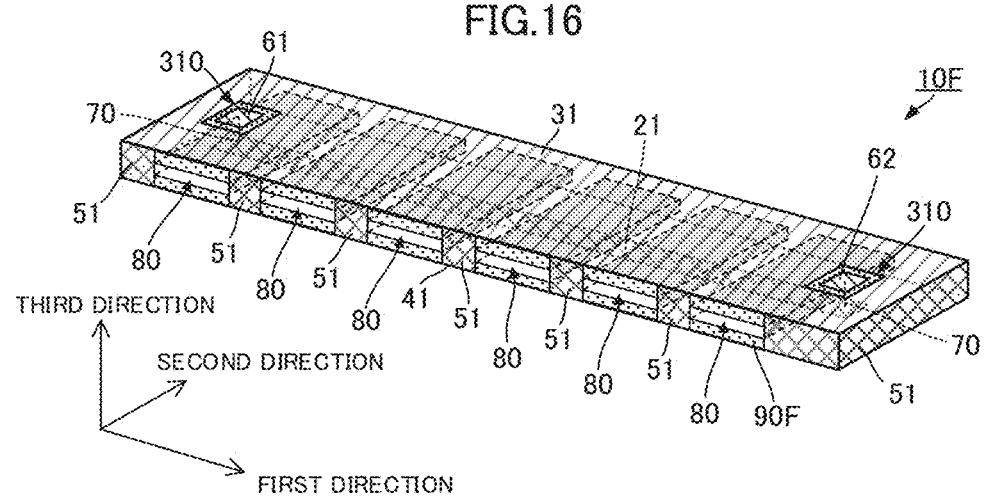
FIG. 16 is an external perspective view of a multilayer circuit board according to a seventh preferred embodiment of the present invention.
Figure 17:
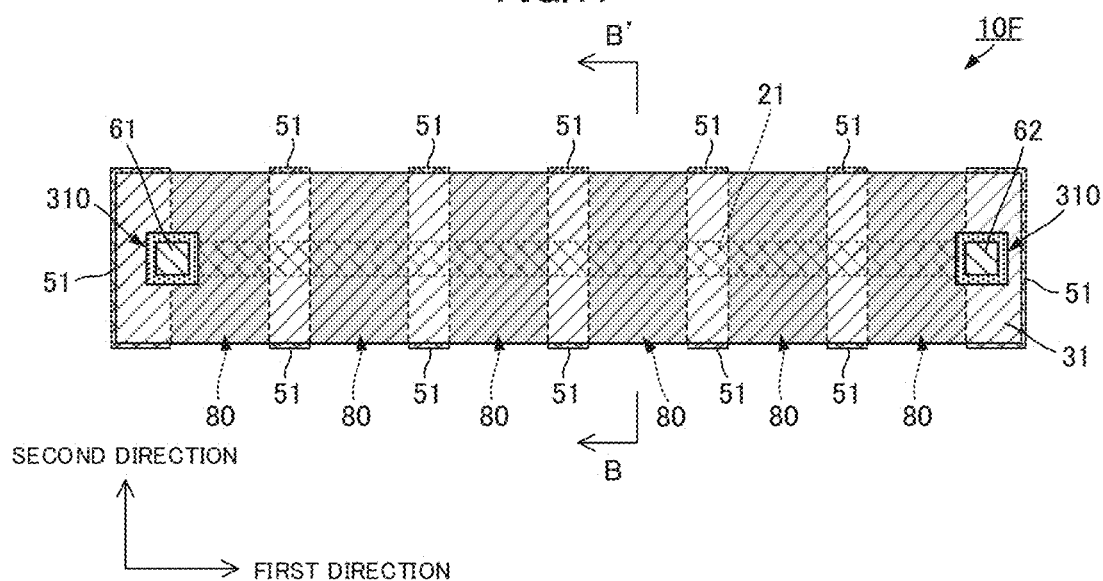
FIG. 17 is a plan view of the multilayer circuit board according to the seventh preferred embodiment of the present invention.
Figure 18:
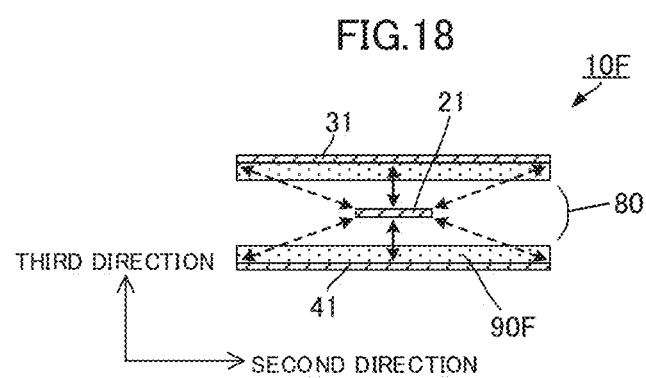
FIG. 18 is a cross section of the multilayer circuit board according to the seventh preferred embodiment of the present invention taken along line B-B' in FIG. 17.

A multilayer circuit board according to a seventh preferred embodiment of the present invention is described below with reference to the drawings. FIG. 16 is an external perspective view of the multilayer circuit board according to the seventh preferred embodiment. FIG. 17 is a plan view of the multilayer circuit board according to the seventh preferred embodiment. FIG. 18 is a cross section of the multilayer circuit board according to the seventh preferred embodiment taken along line B-B' in FIG. 17.

A multilayer circuit board 10F according to the seventh preferred embodiment differs from the multilayer circuit board according to the sixth preferred embodiment in that holes 80 formed on the side surfaces of the laminate penetrates the laminate. Other components of the multilayer circuit board are the same as or similar to those of the multilayer circuit boards according to the sixth preferred embodiment.

More specifically, a signal conductor 21 according to the seventh preferred embodiment corresponds to "an inner conductive pattern", and each of external connection terminals 61, 62 corresponds to an "outer surface conductive pattern".

Referring to FIGS. 16 to 18, the multilayer circuit board 10F includes the holes 80 penetrating both side surfaces parallel or substantially parallel to an extending direction in which the laminate 90F extends (side surfaces in the second direction). More specifically, the holes 80 of the multilayer circuit board 10F penetrate the laminate 90F in a direction orthogonal or substantially orthogonal to the lamination direction, and in a second direction orthogonal or substantially orthogonal to the extending direction of the laminate 90F. In the multilayer circuit board 10F, the holes 80 are formed at regular intervals in the extending direction of the laminate 90F (first direction).

According to the configuration described above, the multilayer circuit board according to the seventh preferred embodiment provides features and advantages similar to the multilayer circuit board 10E according to the sixth preferred embodiment.

According to the multilayer circuit board 10F of the seventh preferred embodiment, the holes 80 are formed not only in areas on both sides in the second direction of the signal conductor 21 and between the first ground conductor 31 and the second ground conductor 41, as indicated by the arrows with broken lines in FIG. 18 but also in an area where the signal conductor 21 is opposed to each of the first and second ground conductors (31, 41), as indicated by the arrows without broken lines in FIG. 18. Accordingly, the multilayer circuit board 10F according to the seventh preferred embodiment is able to lower the capacitance Cs between the signal conductor 21 and each of the first and the second ground conductors (31, 41) to a further extent as compared to the multilayer circuit board 10E that does not include the hole 80 in an area where the signal conductor 21 is opposed to each of the first and the second ground conductors (31, 41).

In view of the above, the seventh preferred embodiment provides the multilayer circuit board in which capacitance between the signal conductor 21 and each of the ground conductors is lowered to a further extent as compared to the multilayer circuit board 10E according to the sixth preferred embodiment.

Eighth Preferred Embodiment

Figure 19:
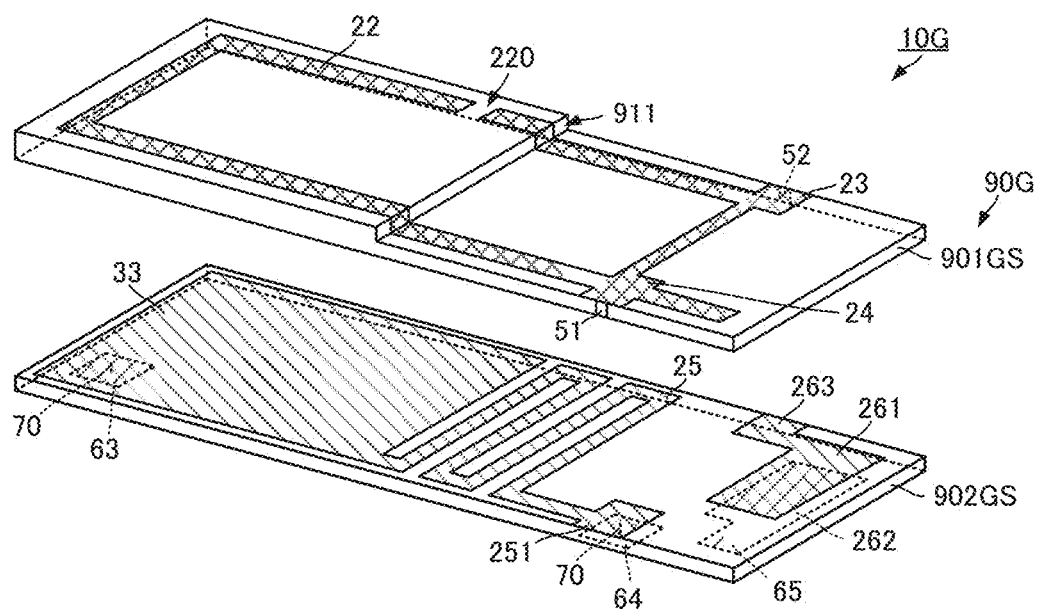
FIG. 19 an exploded perspective view of a multilayer circuit board according to an eighth preferred embodiment of the present invention.
Figure 20:
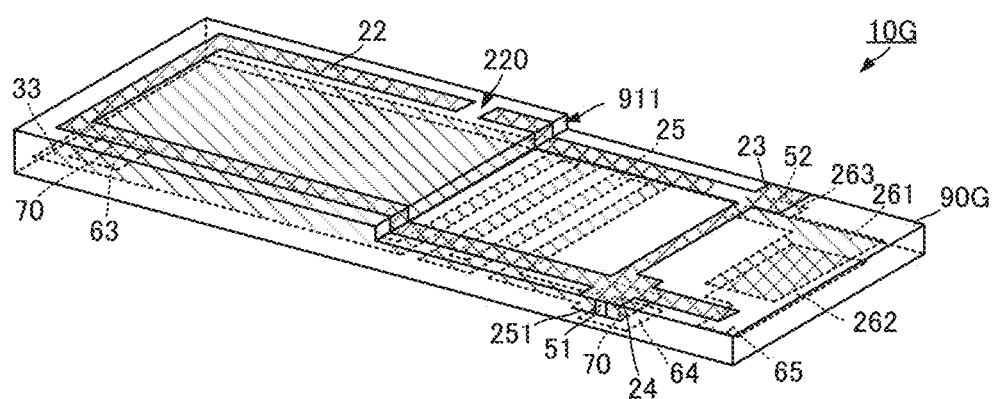
FIG. 20 an external perspective view of the multilayer circuit board according to the eighth preferred embodiment of the present invention.

A multilayer circuit board according to an eighth preferred embodiment of the present invention is described below with reference to the drawings. FIG. 19 is an exploded perspective view of the multilayer circuit board according to the eighth preferred embodiment. FIG. 20 is an external perspective view of the multilayer circuit board according to the eighth preferred embodiment.

A multilayer circuit board 10G according to the eighth preferred embodiment provides an antenna and its peripheral circuits, while each of the multilayer circuit boards according to the first through seventh preferred embodiments provides a transmission line.

A laminate 90G is formed by stacking insulating substrates 901GS, 902GS. The back surface of the insulating substrate 901GS abuts the front surface of the insulating substrate 902GS. The insulating substrates 901GS, 902GS are formed of the same or similar materials as those of the insulating substrates according to the first through seventh preferred embodiments.

The back surface of the insulating substrate 901GS is flat, and the front surface of the insulating substrate 901GS includes a step 911. With the structure described above, the insulating substrate 901GS includes two portions with different thicknesses.

The front surface of the insulating substrate 901GS includes an antenna conductor 22. The antenna conductor 22 is a loop-shaped linear conductor and includes a gap 220 at a midpoint of the loop. The antenna conductor 22 is formed over the step 911 on the front surface of the insulating substrate 901GS. The antenna conductor 22 includes connection land conductors 23, 24 at different intermediate positions in the loop. Each of the connection land conductors 23, 24 is wider than the antenna conductor 22. The positions on the antenna conductor 22 at which the connection land conductors 23, 24 are formed are set according to the characteristics and the like of the antenna. The connection land conductors 23, 24 are formed on the thin portion of the insulating substrate 901GS.

The front and back surfaces of the insulating substrate 902GS are both flat, and the front surface includes an inductor conductor 25, a capacitor conductor 261, and a ground conductor 33. The inductor conductor 25 is a meandering linear conductor. The capacitor conductor 261 and the ground conductor 33 are flat conductors. An inductor defined by the inductor conductor 25, a capacitor defined by the capacitor conductor 261, and the ground conductor 33 are included as circuit devices for an antenna matching circuit, for example.

The ground conductor 33 is provided on the insulating substrate 902GS in an entire or substantially an entire surface of the area that overlaps the thick portion of the insulating substrate 901GS.

One end in the extending direction of the inductor conductor 25 is connected with the ground conductor 33, and the other end is connected with a connection land conductor 251. The connection land conductor 251 is wider than the inductor conductor 25. The connection land conductor 251 is located at the same or substantially the same position as the connection land conductor 24 in a plan view. The connection land conductor 251 is connected with the connection land conductor 24 through an interlayer connection conductor 51 formed on a side surface of the insulating substrate 901GS.

The capacitor conductor 261 is connected with a connection land conductor 263. The connection land conductor 263 is located at the same or at substantially the same position as the connection land conductor 23 in a plan view. The connection land conductor 263 is connected with the connection land conductor 23 through an interlayer connection conductor 52 formed on a side surface of the insulating substrate 901GS.

The back surface of the insulating substrate 902GS includes a capacitor conductor 262, and external connection conductors 63, 64, 65.

The capacitor conductor 262 is opposed to the capacitor conductor 261 through the insulating substrate 902GS. With the structure described above, a capacitor is defined.

The external connection conductor 63 is opposed to the ground conductor 33, and is connected with the ground conductor 33 through an interlayer connection conductor 70 that penetrates the insulating substrate 902GS.

The external connection conductor 64 is opposed to the connection land conductor 251, and is connected with the connection land conductor 251 through the interlayer connection conductor 70 that penetrates the insulating substrate 902GS.

The external connection conductor 65 is connected with the capacitor conductor 262.

The multilayer circuit board 10G with the configuration described above is manufactured by the processes described below.

First, the insulating substrates 901GS is provided. The insulating substrate 901GS is formed by injection molding or the like. Accordingly, the insulating substrate 901GS including the step 911 on the front surface thereof is able to be easily formed.

The antenna conductor 22, the connection land conductors 23, 24, and the interlayer connection conductor 51 are formed on the front and side surfaces of the insulating substrate 901GS by a conductive pattern forming method using a laser irradiation, for example, the LDS process. By applying such a conductive pattern forming method by a laser irradiation, the antenna conductor 22 is able to be reliably and accurately formed even with the step 911.

A double-sided copper-clad and flat insulating substrate 902GS is provided, and the inductor conductor 25, the capacitor conductors 261, 262, the ground conductor 33, the connection land conductors 251, 263, and the external connection conductors 63, 64, 65 are formed by patterning the copper clad using photolithography or the like.

The insulating substrate 902GS includes through holes at positions where the ground conductor 33 overlaps with the external connection conductor 63 and where the connection land conductor 251 overlaps with the external connection conductor 64, and the through holes are plated to form the interlayer connection conductors 70, respectively.

The back surface of the insulating substrate 901GS and the front surface of the insulating substrate 902GS are pressed and ultrasonically welded together. Accordingly, the insulating substrates 901GS, 902GS are joined together without an adhesive, and thus, an accurate positional relationship in the lamination direction between the conductive pattern of the insulating substrate 901GS and the conductive pattern of the insulating substrate 902GS is able to be provided. Accordingly, the characteristics of the multilayer circuit board 10G are able to be improved. Particularly in the eighth preferred embodiment, the distance between the antenna conductor 22 and the ground conductor 33 is able to be fixed with high accuracy, and thus fluctuation of the antenna characteristics caused in a manufacturing process is able to be significantly reduced or prevented. In addition, since a material including different physical properties is not included between the insulating substrates 901GS, 902GS, occurrence of peeling due to a difference of physical properties is able to be avoided.

Preferably, a protective insulating resist film (not shown) is provided on the front and side surfaces of the laminate 90G, for example.

Ninth Preferred Embodiment

Figure 21:
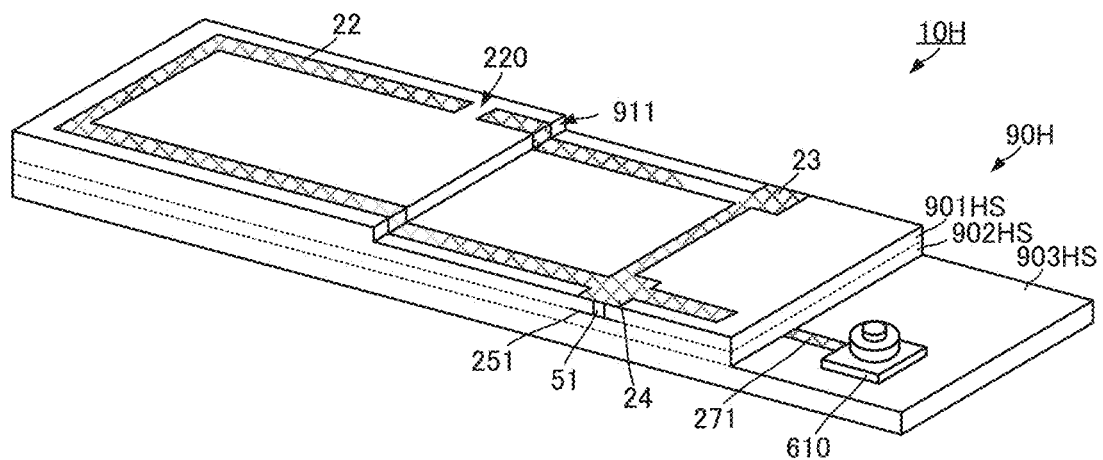
FIG. 21 is an external perspective view of a multilayer circuit board according to a ninth preferred embodiment of the present invention.

A multilayer circuit board according to a ninth preferred embodiment of the present invention is described below with reference to the drawings. FIG. 21 is an external perspective view of the multilayer circuit board according to the ninth preferred embodiment.

A multilayer circuit board 10H according to the ninth preferred embodiment differs from the multilayer circuit board 10G according to the eighth preferred embodiment in a structure of a laminate 90H that includes a connector 610.

The laminate 90H includes insulating substrates 901HS, 902HS, 903HS. The structures of the insulating substrates 901HS, 902HS are basically the same as or similar to those of the insulating substrates 901GS, 902GS according to the eighth preferred embodiment.

The insulating substrate 903HS abuts the back surface of the insulating substrate 902HS. The insulating substrate 903HS includes a dimension larger than that of the insulating substrate 902HS in a plan view.

The connector 610 is mounted on an externally exposed portion of the front surface of the insulating substrate 903HS. The connector 610 is connected with a circuit device (for example, antenna conductor 22) provided on the laminate 90H through a connection conductor 271 formed on the front surface of the insulating substrate 903HS.

According to the configuration described above, the multilayer circuit board is able to be easily connected with an external terminal. In addition, the connector 610 is mounted on a thin portion of the laminate 90H which is formed only from the insulating substrate 903HS, and thus an externally connecting portion is highly flexible, thereby increasing the mounting flexibility.

Tenth Preferred Embodiment

Figure 22:
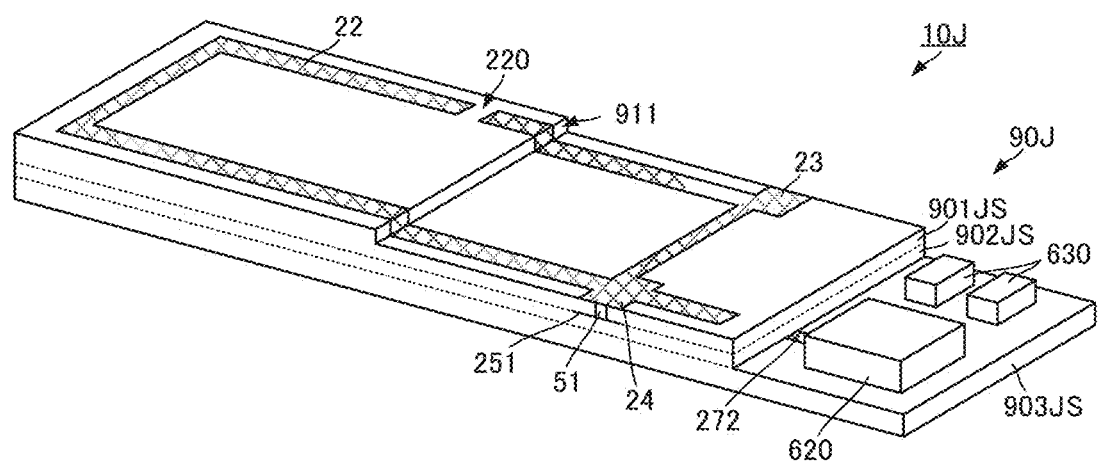
FIG. 22 is an external perspective view of a multilayer circuit board according to a tenth preferred embodiment of the present invention.

A multilayer circuit board according to a tenth preferred embodiment of the present invention is described below with reference to the drawings. FIG. 22 is an external perspective view of the multilayer circuit board according to the tenth preferred embodiment.

A multilayer circuit board 10J according to the tenth preferred embodiment differs from the multilayer circuit board 10H according to the ninth preferred embodiment in the components mounted on an insulating substrate 903JS.

A laminate 90J includes insulating substrates 901JS, 902JS, 903JS. The structures of the insulating substrates 901JS, 902JS are basically the same as or similar to those of the insulating substrates 901HS, 902HS according to the ninth preferred embodiment.

Electronic components 620, 630 are mounted on an externally exposed portion of the front surface of the insulating substrate 903JS. The electronic component 620 is connected with a circuit device (for example, antenna conductor 22) provided on the laminate 90J through a connection conductor 272 that is located on the front surface of the insulating substrate 903JS. The electronic components 630 are mounted through a connection conductor located on the insulating substrate 903JS to define an antenna matching circuit by an antenna conductor 22.

According to the configuration described above, the antenna matching circuit and the mounting components are able to be integrally formed with the antenna. An inductor conductor, a capacitor conductor or the like formed on the laminate 90J may also be included as the antenna matching circuit, for example.

Eleventh Preferred Embodiment

Figure 23:
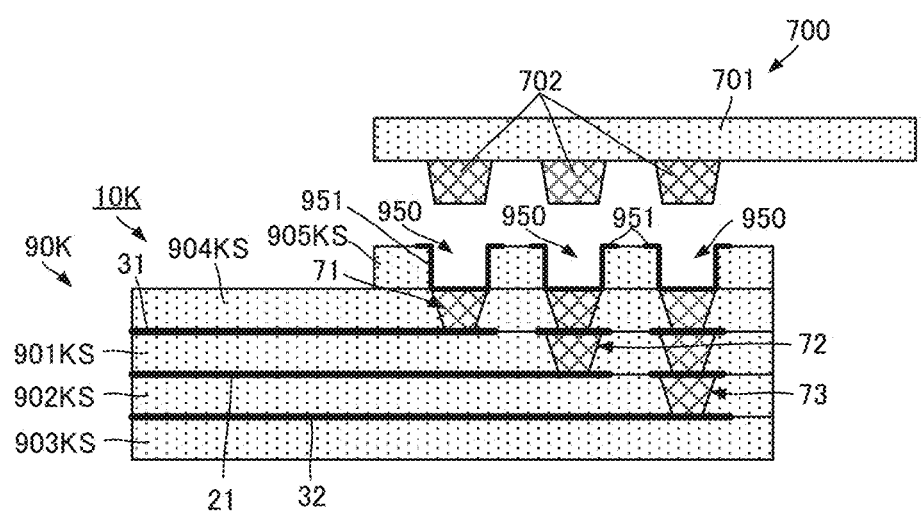
FIG. 23 is a partial cross section of a multilayer circuit board according to an eleventh preferred embodiment of the present invention.

A multilayer circuit board according to an eleventh preferred embodiment of the present invention is described below with reference to the drawings. FIG. 23 is a partial cross section of the multilayer circuit board according to the eleventh preferred embodiment.

A multilayer circuit board 10K according to the eleventh embodiment differs from the multilayer circuit board 10 according to the first embodiment in the structure of a portion that provides an external connection.

A laminate 90K is formed by stacking an insulating substrate 905KS, an insulating substrate 904KS, an insulating substrate 901KS, an insulating substrate 902KS, and an insulating substrate 903KS in this order. A signal conductor 21 is formed on the contact surface between the insulating substrate 901KS and the insulating substrate 902KS. A first ground conductor 31 is formed on the contact surface between the insulating substrate 901KS and the insulating substrate 904KS. A second ground conductor 32 is formed on the contact surface between the insulating substrate 902KS and the insulating substrate 903KS.

An interlayer connection conductor 71 is formed of a conductive material that fills a through hole formed in the insulating substrate 904KS. The interlayer connection conductor 71 is connected with the first ground conductor 31.

An interlayer connection conductor 72 is formed of a conductive material that fills through holes formed in the insulating substrates 904KS, 901KS, and an auxiliary conductor on the interface between the insulating substrates 904KS, 901KS. The interlayer connection conductor 72 is connected with the signal conductor 21.

An interlayer connection conductor 73 is formed of a conductive material that fills through holes formed in the insulating substrates 904KS, 901KS, 902KS, and auxiliary conductors on the interfaces between the insulating substrates 904KS, 901KS and on the interface between the insulating substrates 901KS, 902KS. The interlayer connection conductor 73 is connected with the second ground conductor.

The interlayer connection conductors 71, 72, 73 are exposed on the interface between the insulating substrate 904KS and the insulating substrate 905KS.

The insulating substrate 905KS includes depressions 950 that are located at positions that overlap with the interlayer connection conductors 71, 72, 73. The depressions 950 are covered with conductors 951. According to the structure described above, the laminate 90K is able to include female connectors.

Each of the conductors 951 is formed by a conductive pattern forming method using laser irradiation. Although it is difficult to form a conductor on a depression by printing or the like, the conductors 951 are able to be reliably formed on the surface of each of the depressions 950 by the method described above.

A male connector 700 includes a body 701 and conductive projections 702. The conductive projections 702 are engaged with the depressions 950 covered with the conductors 951. With the structure described above, the male connector 700 is able to be connected with the laminate 90K.

In view of the above, the eleventh preferred embodiment is able to provide reliable formation of the conductors on a connector portion including steps on the surface of the multilayer circuit board 10K.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer circuit board comprising:
   a laminate including a plurality of insulating substrates that are stacked; and
   a conductor provided in the laminate; wherein
   the plurality of insulating substrates include a first insulating substrate and a second insulating substrate, each of the first insulating substrate and the second insulating substrate includes a curved face located at an intermediate position in an extending direction where a thickness of each of the first insulating substrate and the second insulating substrate changes;

a Laser Direct Structuring additive is added or applied to the first insulating substrate;

the conductor is plated on an area including the curved face where the Laser Direct Structuring additive is irradiated with a laser; and the curved faces of the first insulating substrate and the second insulating substrate are abutted to each other, and a thicker portion of the first insulating substrate overlies a thinner portion of the second insulating substrate and a thinner portion of the first insulating substrate overlies a thicker portion of the second insulating substrate.

2. The multilayer circuit board according to claim 1, wherein an outer surface conductor is provided on a surface on the second insulating substrate located at an opposite side of another surface of the second insulating substrate abutted to the first insulating substrate.

3. The multilayer circuit board according to claim 2, wherein the Laser Direct Structuring additive is added or applied to the second insulating substrate, and the outer surface conductor is plated on another area where the Laser Direct Structuring additive is irradiated with a laser.

4. The multilayer circuit board according to claim 2, wherein the conductor and the outer surface conductor are connected with each other.

5. The multilayer circuit board according to claim 1, wherein a portion of the conductor is located at a position that is different from another portion of the conductor in a lamination direction of the laminate.

6. The multilayer circuit board according to claim 1, wherein
   a side surface conductor is provided on a side surface of the laminate; and
   at least one hole is provided in the side surface of the laminate in an area where the side surface conductor is not located.

7. The multilayer circuit board according to claim 1, wherein
   an outer surface conductor is provided on a side surface of the laminate; and
   at least one hole is provided in the side surface of the laminate in an area where the outer surface conductor is not located.

8. The multilayer circuit board according to claim 6, wherein
   the at least one hole includes a plurality of holes; and
   the plurality of holes are located at regular intervals in the extending direction of the laminate.

* * * * *